United States Patent
Suzumura et al.

(10) Patent No.: US 6,737,153 B2
(45) Date of Patent: May 18, 2004

(54) CIRCUIT BOARD AND METHOD FOR MANUFACTURING THE SAME, AND ELECTRONIC APPARATUS COMPRISING IT

(75) Inventors: Masaki Suzumura, Mie (JP); Fumiaki Hashimoto, Mie (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 81 days.

(21) Appl. No.: 10/088,035

(22) PCT Filed: Jul. 17, 2001

(86) PCT No.: PCT/JP01/06197

§ 371 (c)(1),
(2), (4) Date: Jun. 28, 2002

(87) PCT Pub. No.: WO02/07485

PCT Pub. Date: Jan. 24, 2002

(65) Prior Publication Data

US 2002/0181211 A1 Dec. 5, 2002

(30) Foreign Application Priority Data

Jul. 18, 2000 (JP) ........................................ 2000-216932

(51) Int. Cl.$^7$ ................................................ H05W 7/02
(52) U.S. Cl. .................... 428/209; 428/618; 428/624; 428/458; 428/901; 361/748; 361/760
(58) Field of Search ................... 428/458, 209, 428/901, 325, 624, 621, 618; 361/704, 707, 709, 748, 752, 760

(56) References Cited

U.S. PATENT DOCUMENTS 5,837,356 A    11/1998   Katori et al. ................ 428/210
6,294,244 B1 *  9/2001   Iwaida et al. ............... 428/209

FOREIGN PATENT DOCUMENTS

EP    0802711 A2    10/1997
JP    07-86704      3/1995

OTHER PUBLICATIONS

International Search Report corresponding to application No. PCT/JP01/06197 dated Oct. 3, 2001.
English translation of Form PCT/ISA/210.

* cited by examiner

Primary Examiner—Stephen Stein
(74) Attorney, Agent, or Firm—RatnerPrestia

(57) ABSTRACT

A circuit board comprising a composite resin and a metal plate, the metal plate forming circuit patterns. The composite resin comprises 70–95 parts by weight of inorganic filler, and 5–30 parts by weight of a resin composition including a thermosetting resin and a hardener. The metal plate is surface treated to reinforce the adhesion at least at one surface contacting with the composite resin. The composite resin fills spaces between the circuit patterns, and the composite resin composition and the metal plate form a plane at a side of the metal plate for mounting components. Since the resin composition including the inorganic filler is also present in the spaces between circuit patterns of a metal plate, heat dissipation characteristic of the circuit board is extremely high, and is suited for electronic apparatus containing heat generating parts such as power circuit.

12 Claims, 5 Drawing Sheets

CIRCUIT BOARD AND METHOD FOR MANUFACTURING THE SAME, AND ELECTRONIC APPARATUS COMPRISING IT

THIS APPLICATION IS A U.S. NATIONAL PHASE APPLICATION OF PCT INTERNATIONAL APPLICATION PCT/JP01/06197.

TECHNICAL FIELD

The present invention relates to a circuit board enhanced in heat dissipation characteristics, its manufacturing method, and an electronic apparatus using the same.

BACKGROUND ART

Recently, in the trend of electronic apparatus becoming higher in performance and smaller in size, electronic components such as semiconductors and the like are required to be high density and to have multiple functions. The circuit board on which they are mounted is also desired to be smaller in size and high density. As a result, it is an important problem how to dissipate the heat generated in power semiconductors and the like mounted at high density.

To improve the heat dissipation characteristic, for example, the prior arts shown in FIG. 8 and FIG. 9 are known. In FIG. 8 and FIG. 9, the conventional circuit board improved in heat dissipation characteristic is composed of a metal plate 11, an insulation layer 12, a conductor foil 13, electronic components 14 including a power semiconductor, and external connection terminals 15.

The conductor foil 13 is adhered to the metal plate 11 by way of the insulation layer 12. This conductor foil 13 is etched and formed into a circuit pattern. Heat generated from electronic components 14 is transferred to the metal plate 11 through the insulation layer 12. A radiator 16 is used to assist the heat dissipation if it is insufficient with the metal plate 11 alone.

In the conventional configuration, the heat dissipation characteristic of the circuit board is determined by a thickness of the conductor foil 13 and the insulation layer 12 formed between the metal plate 11 and the conductor foil 13, and therefore the heat dissipation characteristic could not be enhanced sufficiently.

The present invention is intended to address the above problem, and it is hence an object of the present invention to provide a circuit board enhanced in the heat dissipation characteristic and an electronic apparatus using the same.

DISCLOSURE OF THE PRESENT INVENTION

The circuit board of the present invention comprises a sheet made of composite resin (hereinafter called sheet), and a metal plate overlaid on this sheet, wherein the metal plate forms circuit patterns. As the metal plate, copper or copper alloy of excellent heat conductivity is preferably used. The sheet is composed of 70–95 parts by weight of inorganic filler, and 5–30 parts by weight of resin composition containing thermosetting resin and a hardener. The sheet may contain, if necessary, a hardening accelerator. The metal plate is roughened and reinforced for adhesion at least on one surface adhering to the sheet.

In the circuit board of the present invention, the composite resin fills the spaces between the circuit patterns, and a plane is formed by the composite resin and the metal plate at a surface of the metal plate for mounting components. Also in the circuit board of the present invention, since the composite resin containing the inorganic filler is also present between the circuit patterns composed of the metal plate, its heat dissipation characteristic is very high, and it is suited as a circuit board for electronic apparatus such as power circuits which contain heat generating components.

BEST MODE FOR CARRYING OUT THE INVENTION

Figure 1:
FIG. 1 is a sectional view showing a configuration of a sheet in an embodiment of the present invention.

The sheet used in the present invention comprises 70–95 parts by weight of inorganic filler and 5–30 parts by weight of resin composition containing thermosetting resin and hardener. The sheet may contain, if necessary, a hardening accelerator. Further adding 0.1–2 parts by weight of solvents against the total amount of 100 parts by weight of inorganic filler and thermosetting resin composition provides the sheet of more enhanced flexibility and processability.

The additive solvent is preferred to be at least one solvent selected from the group consisting of methyl ethyl ketone, isopropanol, toluene, ethyl carbitol, butyl carbitol, and butyl carbitol acetate. These solvents are easy to handle, and improve the elasticity at room temperature of thermosetting resin for composing the sheet, thereby adjusting to a proper viscosity suited to forming and processing.

An example of composition of the sheet of the present invention is preferred to be as follows, supposing the total amount of the thermosetting resin composition to be 100 parts by weight:

1) 0–45 parts by weight of solid resin at room temperature,
2) 5–50 parts by weight of liquid resin at room temperature,
3) 4.9–45 parts by weight of hardener, and
4) 0.1–5 parts by weight of hardening accelerator.

In this composition, a sheet having excellent flexibility and processability can be obtained.

The liquid thermosetting resin at room temperature is preferably one selected from bisphenol A type epoxy resin, bisphenol F type epoxy resin, and liquid phenol resin, or a mixture thereof. These liquid resins can maintain the stable B-stage, and have excellent electric insulating characteristic and mechanical strength after curing.

In the sheet of the present invention, the main component of the thermosetting resin composition is preferred to be at least one selected from epoxy resin, phenolic resin, xylene resin, polyimide resin, polyester resin, diallyl phthalate resin, and triallyl isocyanurate resin.

The sheet of the present invention is preferred to contain brominated multifunctional epoxy resin as the main component of the thermosetting resin, bisphenol A type novolak resin as hardener, and imidazole as hardening accelerator. In this composition, the circuit board after curing is excellent in flame retardant property, and also superior in electric insulating characteristic and mechanical strength.

A specific composition is, preferably, 60–80 parts by weight of brominated multifunctional epoxy resin, 18–39.9 parts by weight of bisphenol A type novolak resin as hardener, and 0.1–2 parts by weight of imidazole as hardening accelerator.

The sheet of the present invention is preferred to contain further at least one additive selected from coupling agent, dispersant, coloring agents, and releasing agent.

In the sheet of the present invention, the organic filler is preferably at least one filler selected from $Al_2O_3$, MgO, BN, and AlN. These fillers are excellent in heat conductivity.

The average particle size of the organic filler is preferred to be in a range of 0.1–100 μm. A mixture slurry is prepared by mixing 70–95 parts by weight of the inorganic filler, 4.9–28 parts by weight of the thermosetting resin composition, and 0.1–2 parts by weight of the solvent, and the slurry is applied to form a film of a desired thickness.

The film can be formed by at least one of a doctor blade method, a coating method, and an extrusion method.

An example of a metal plate used in the present invention is a copper lead frame. A circuit patterns may be obtained by punching a copper plate into a desired shape using a die, or a circuit patterns may be formed by etching from both surfaces of the plate. The thickness of the copper plate may be properly selected depending on the required heat dissipation characteristic, and the effect of the present invention is particularly exhibited when the thickness is at least 180 μm or more. That is, in a conventional circuit board production, a circuit pattern is formed by etching from one side only, thus, as the thickness of copper foil increases a processing cost increases, and it is not practical. By contrast, a circuit pattern of the present invention employs an ordinary rolled copper plate, which is inexpensive. Thus, in the circuit board of the present invention, the heat conductivity can be enhanced easily by using a thick copper plate. It is therefore the biggest feature of the present invention that the circuit board of high heat conductivity can be formed inexpensively.

In the lead frame, a region for mounting circuit components in the central portion and a terminal portion connected to the mounting region are formed depending on the required characteristic, and the terminal portion is linked by the frame portion disposed at a periphery of the central portion.

Part of the components mounting regions are linked in linkage portions which become finally unnecessary. That is, in a later process, the linkage portions of the lead frame are punched and cut off, and the components mounting region is formed independently like a floating island. Through the components mounting region, the circuit components are wired, which is effective means for reduction of size and enhancement of circuit design efficiency.

According to the present invention, the terminal portion is formed integrally with the components mounting region, which is effective for saving the components.

The frame portions for linking to the terminal portion are cut off after mounting the electronic components, bent for taking out the terminal portions, and are effectively utilized as terminals for connecting to other circuits.

The surface of the processed lead frame is generally treated by nickel plating or solder plating to prevent oxidation of copper.

A surface of the lead frame for integrally formed with the sheet is roughened by sand blasting or other method to reinforce the adhesion strength of the sheet, so that the sheet may easily be adsorbed physically when it is heated and melted.

Further, it is extremely effective to form an oxide layer on the copper surface roughened for reinforcing the adhesion strength. Besides, the adhesion strength of the sheet can be also reinforced by treating the surface with triazine derivative compounds.

The sheet of the present invention, specifically in a state of an electric insulating thermal conductive board by curing the thermosetting resin component, preferably has a coefficient of thermal expansion in a range of 8–20 ppm/° C., and a heat conductivity in a range of 1–10 W/mK. This thermal conductive board does not deform thermally, and its coefficient of thermal expansion is close to a coefficient of thermal expansion of the copper plate lead frame.

In the present invention, moreover, spaces between the circuit patterns of the lead frame are filled with the sheet, and the lead frame and the resin layer form a flat plane. Thus, electronic components can be easily mounted on the lead frame. Further, the lead frame is extremely thick as compared with the copper foil usually used in the circuit board, and is excellent in heat diffusion for a heat dissipation, and therefore a heat resistance can be suppressed low.

According to the present invention, by further forming a heat dissipation metal plate on a surface opposite to a bonding surface of the sheet to the lead frame, heat diffusion is further promoted and the heat resistance is suppressed lower, so that a circuit board excellent in heat dissipation and also in mechanical strength is obtained.

A manufacturing method of the circuit board for heat dissipation of the present invention is explained below.

First, a patterned copper lead frame is overlaid on the sheet, pressed and bonded provisionally at a temperature lower than a curing temperature of the thermosetting resin composition and at a pressure of 10–200 kg/cm². In this stage, the spaces between the circuit patterns of the lead frame is filled with the sheet, and the lead frame and the resin form a common plane, and are integrated.

Afterwards, the cutting off parts of the lead frame linkage portion are punched off, and a pressure of 10 to 200 kg/cm² is applied at a temperature of the curing reaction. At the same time, spaces punched off together with the unnecessary lead frame are filled with the thermosetting resin, and the thermosetting resin is cured. As a result, a circuit board is formed in an integrated state of the lead frame and sheet.

Or, to fill the punched off spaces with the thermosetting resin, other sheet may be further overlaid and integrated by heating and pressing under the curing reaction temperature.

It is also preferred to dispose a heat dissipation metal plate further on a surface of the sheet opposite to the surface where the lead frame is adhering. In this case, on the heat dissipation metal plate, more preferably, another sheet may be pressed and bonded at a temperature below the curing temperature of the thermosetting resin beforehand.

In the present invention, the temperature of heating and pressing process is preferred to be in a range of 50–120° C. in provisional bonding, and in a range of 120–200° C. in final curing of the thermosetting resin.

As described above, according to the present invention, a circuit board of high heat conductivity, excellent in components mounting and idealistic for power circuit is obtained by processing the sheet in a desired shape by making use of the flexibility of the sheet, overlaying the sheet with the patterned lead frame, and curing the sheet to form a highly heat conductive circuit board. The circuit has a circuit configuration independent to the outer circumference and is enhanced in the heat dissipation characteristic.

Referring to the drawings, preferred embodiments of the present invention are described below.

First Embodiment

FIG. 1 is a sectional view showing an embodiment of the present invention. In FIG. 1, a sheet 1 is formed on a releasing film 2. In its forming method, sheet 1 is formed by applying a mixture slurry including at least an inorganic filler, a thermosetting resin composition, and a solvent on the releasing film 2. The sheet 1 can be formed by any known method such as doctor blade method, coating method, or extrusion method. After applying the slurry and drying only the solvent of the slurry, a flexible sheet 1 is obtained.

Similarly, by preparing a mixture slurry including at least an inorganic filler, a solid thermosetting resin at room temperature, a liquid thermosetting resin composition at room temperature, and a solvent, a flexible sheet 1 can be obtained in the same manner by applying the slurry on a releasing film 2, and drying the solvent.

Examples of the thermosetting resin include epoxy resin, phenolic resin, xylene resin, polyimide resin, polyester resin, diallyl phthalate resin, and triallyl isocyanurate resin (BT resin).

The organic filler includes $Al_2O_3$, MgO, BN, and AlN.

The liquid thermosetting resin at room temperature includes epoxy resins such as bisphenol A type epoxy resin, bisphenol F type epoxy resin, and liquid phenolic resin.

Examples of the solvent are methyl ethyl ketone, isopropanol, toluene, ethyl carbitol, butyl carbitol, and butyl carbitol acetate.

If necessary, further, various additives, such as coupling agents such as silane coupling agent, titanate coupling agent, aluminate coupling agent, dispersants, coloring agents, and releasing agent may be added to the composition of the sheet 1.

As described above, by adding the solvent, adding the liquid thermosetting resin at room temperature, and drying the solvent, a semi-cured or partly cured sheet 1 having a viscosity suited to processing ($10^2$ to $10^5$ Pa·s) is obtained. Even if the viscosity is out of the above viscosity ranges, a resin composition with a wider viscosity range can be used by controlling the working temperature or pressing condition.

The resin obtained by curing the sheet 1 contains a large amount of inorganic filler, and is excellent in heat dissipation characteristic, and since the coefficient of thermal expansion is nearly same as the copper lead frame, a wiring board of an excellent heat conductivity is obtained.

A manufacturing method of the circuit board of the present invention is explained below by referring to the drawings. FIG. 2 to FIG. 5 are diagrams showing the manufacturing process of the circuit board fabricated by using the sheet 1.

Figure 2:
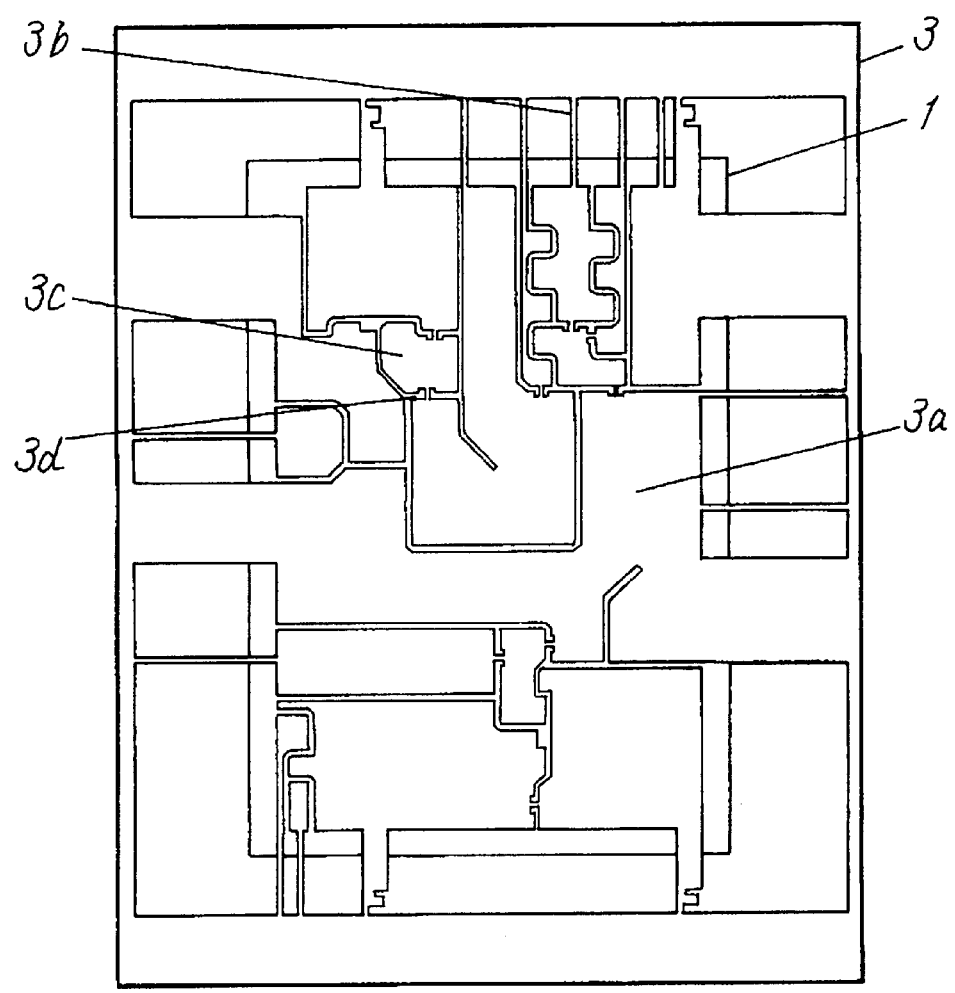
FIG. 2 is a plan view of a circuit board fabricated by using the sheet in the embodiment of the present invention.

In FIG. 2, sheet 1 prepared by the process explained above is integrated with a lead frame 3, in which patterns are formed, by primary forming where the pressing is performed at a temperature of 50–120° C. which is a lower than a curing temperature of the sheet 1. FIG. 2 is a top view of the sheet 1 integrated beneath the lead frame 3.

The circuit patterns of the lead frame 3 can be obtained either by punching a copper plate in a desired shape by using a die, or by etching.

In the lead frame 3, a region 3a for mounting circuit components and a terminal portion 3b formed in the peripheral area are formed, and the peripheral terminal portion 3b is linked in the outer circumference. In part of a mounting region 3c, there is a linkage portion 3d which becomes finally unnecessary and removed in a later process.

A surface of the processed lead frame 3 for mounting components is treated by nickel plating or solder plating to prevent oxidation of copper.

Further, a surface of the lead frame 3 at a side integrated with the sheet 1 is roughened by sand blasting in order to strengthen the adhesion strength so that the sheet 1 may easily be adsorbed physically when the sheet 1 is heated and melted. Moreover, by oxidizing the roughened surface, the adhesion between of the sheet 1 and lead frame 3 is further enhanced.

Figure 3:
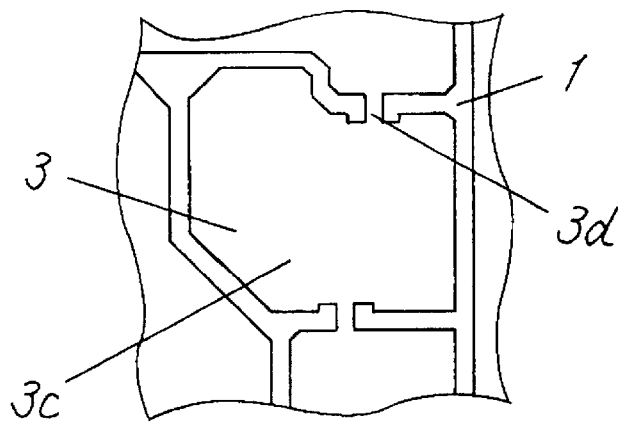
FIG. 3 shows an essential part of FIG. 2.
Figure 4:
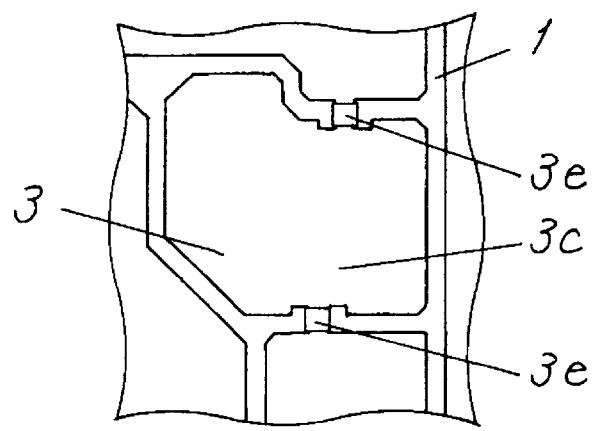
FIG. 4 shows an essential part of FIG. 2.

FIG. 3 and FIG. 4 are partial views showing the state before and after a punching off of the linkage portion 3d which is finally unnecessary, together with the sheet 1, from the mounting region 3c. The punching is performed after overlaying and integrating the lead frame 3 and sheet 1.

Figure 5:
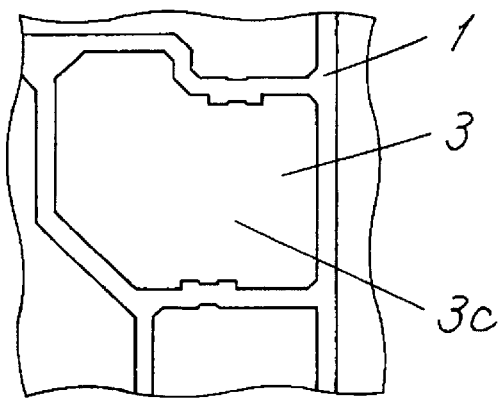
FIG. 5 shows an essential part of FIG. 2.

FIG. 5 shows a state of after a heating and pressing the integrated sheet 1 again at a temperature of 120–200° C., in which holes 3e formed by the punching are filled to the surface of the circuit pattern of the lead frame 3 with the sheet 1, and the thermosetting resin in the sheet 1 is cured. As shown in FIG. 5, by filling the holes 3e formed by the punching with the thermosetting resin, the insulation of the mounting region 3c from the peripheral lead frame is assured.

Figure 6:
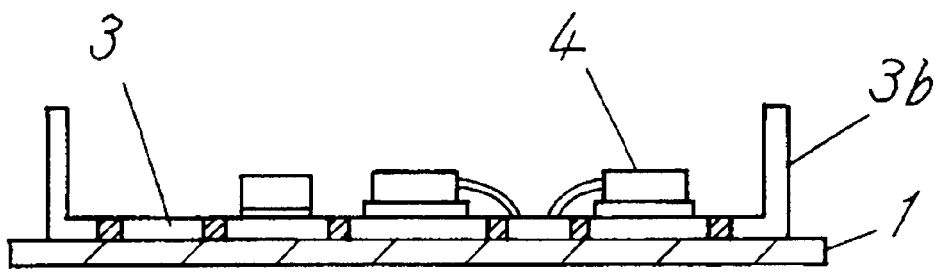
FIG. 6 is a sectional view of a circuit board fabricated by a method shown in FIG. 5, with its terminal section being cut off and bent upward.

In FIG. 6, after mounting electronic components 4 by soldering, the lead frame 3 is cut off by leaving a necessary area, and the terminal portion 3b of the lead frame 3 is perpendicularly bent so as to form a lead-out electrode. A principal section of an electronic apparatus mounting electronic components or semiconductor components is thus completed. The subsequent procedure includes the processes of assembling the principal section into a case and enclosing with an insulating resin, but these processes are known and are not the essential points of the present invention, and the explanation is omitted.

The bent terminal portion 3b has a sufficient mechanical strength, and can be hence directly connected to the connector or the like.

Second Embodiment

A second embodiment of the present invention is explained.

Figure 7:
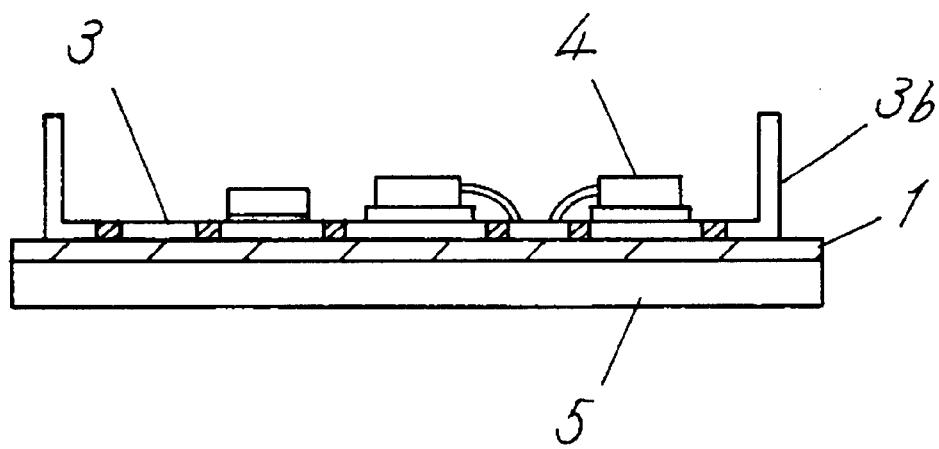
FIG. 7 is a sectional view of a circuit board in another embodiment of the present invention.
Figure 8:
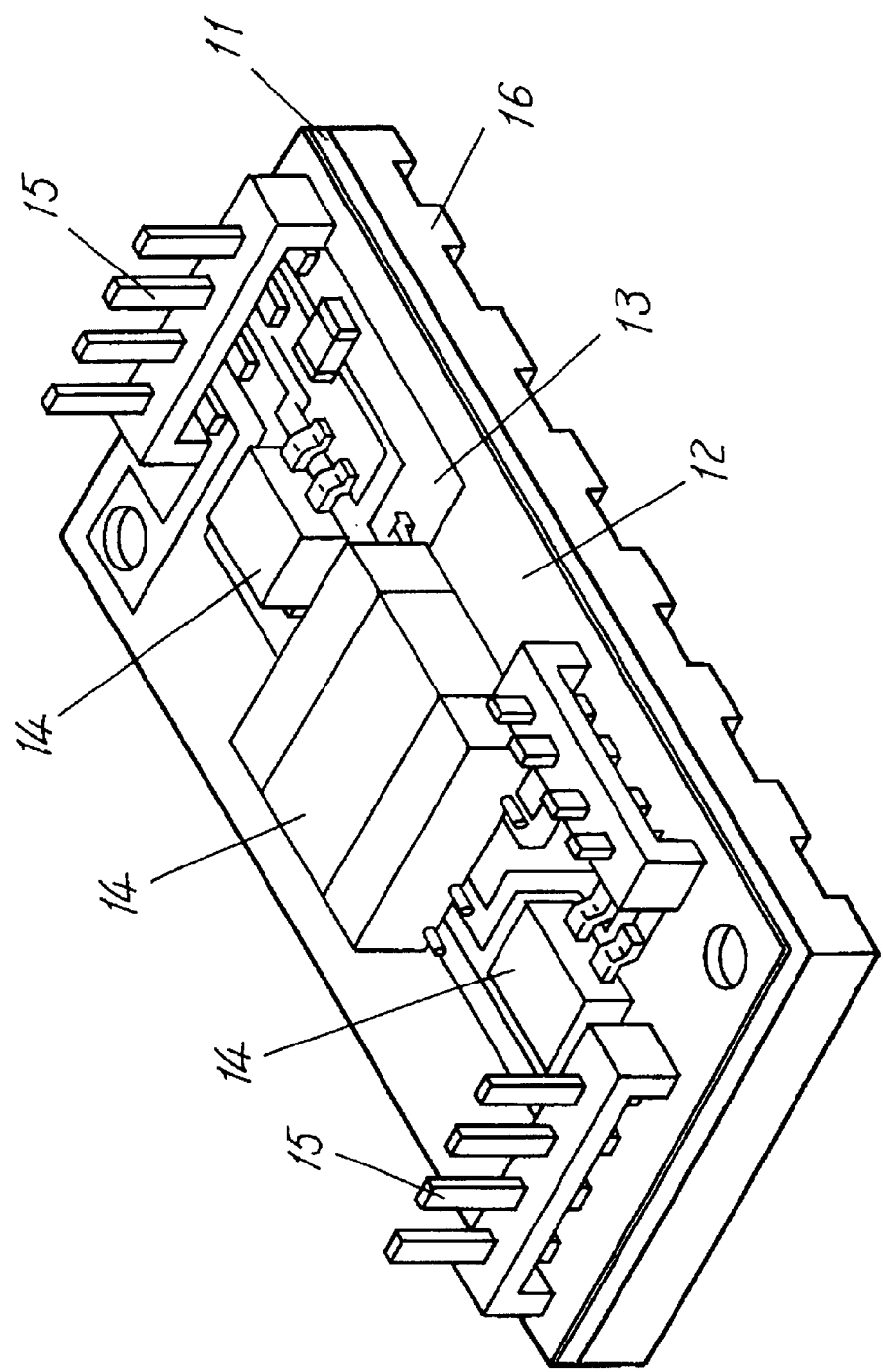
FIG. 8 is a perspective view of a conventional circuit board.
Figure 9:
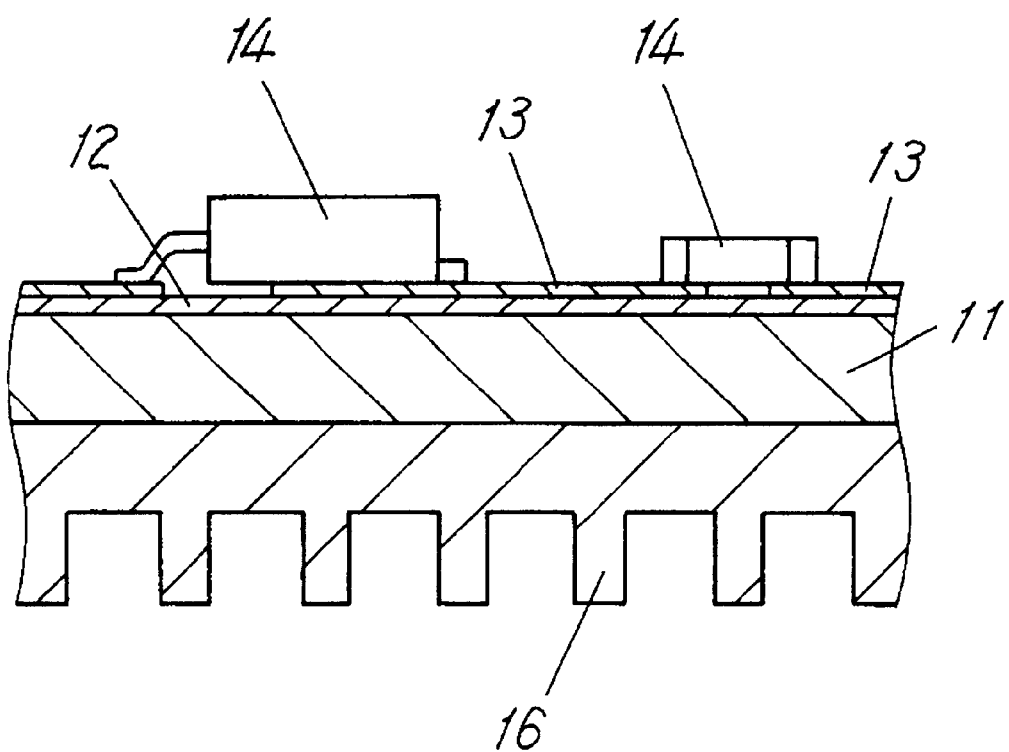
FIG. 9 is a sectional view of the conventional circuit board.

In FIG. 7, a heat dissipation metal plate 5 is further formed on the opposite side of the sheet 1 adhered to the lead frame 3. The heat dissipation metal plate 5 is selected in consideration of the heat conductivity and coefficient of expansion, and a plate material of aluminum or its alloy is preferably used because it is effective to maintain the circuit board strength and the cost is low.

The heat dissipation metal plate 5 is integrated with another sheet 1 in advance by pressing at a low temperature of 50–120° C., and it is heat pressed to the lower side of the sheet 1 in FIG. 6, so that a circuit board with stable characteristic is manufactured. In this process, the working efficiency is also excellent.

In the foregoing explanation of embodiments, as a metal for forming circuit patterns, a copper plate is used. However, as it may be easily understood, the metal material used in the circuit board of the present invention is not limited to copper plate, but any other metal plate may be used as far as the heat conductivity is high.

INDUSTRIAL APPLICABILITY

As explained herein, the circuit board of the present invention has a structure where a composite resin for forming a sheet fills spaces between circuit patterns, and a plane is formed in the sheet at the components mounting side of the lead frame. A metal plate thicker than a conventional copper foil is used in the circuit pattern, and a resin layer containing an inorganic filler excellent in heat conductivity is present between the circuit pattern, so that the heat dissipation characteristic of the circuit board of the present invention is very high. Therefore, the circuit board of the present invention is suited to be used in a power circuit or the like where a high heat dissipation characteristic is requested.

What is claimed is:

1. A circuit board comprising:
a metal plate having a shape of a plurality of circuit patterns; a composite resin layer filled in spaces between said circuit patterns, said spaces filled in including further filled in spaces between said circuit patterns previously occupied by linkage portions linking said plurality of circuit patterns, and a composite resin layer formed at a back surface against a surface of the metal plate for mounting components.

2. The circuit board of claim 1, wherein said metal plate is one selected from copper and copper alloy.

3. The circuit board of claim 1, wherein said composite resin layer comprises 70–95 parts by weight of an inorganic filler, and 5–30 parts by weight of resin composition including a thermosetting resin and a hardener.

4. The circuit board of claim 3, wherein said composite resin layer further includes a hardening accelerator.

5. The circuit board of claim 1, wherein a surface of said circuit patterns and a surface of the composite resin layer filled in the spaces between the circuit patterns form a common plane.

6. The circuit board of claim 1, wherein one of said circuit patterns has a portion independent of other circuit patterns.

7. The circuit board of claim 1, wherein parts of said circuit patterns also serve as external connection terminals.

8. The circuit board of claim 7, wherein said external connection terminals are formed by folding said circuit patterns.

9. The circuit board of claim 1, wherein a second metal is laminated through said composite resin layer formed at the back surface of said metal plate.

10. The circuit board of claim 9, wherein said second metal is a heat dissipation plate.

11. An electronic apparatus comprising:
a circuit board having electronic components mounted thereon, said circuit board comprising:
a metal plate having a shape of a plurality of circuit patterns; a composite resin layer filled in spaces between said circuit patterns, said spaces filled in including further filled in spaces between said circuit patterns previously occupied by linkage portions linking said plurality of circuit patterns, and a composite resin layer formed at a back surface against a surface of the metal plate for mounting components.

12. The electronic apparatus of claim 11, further comprising a metal laminated through the composite resin layer formed at the back surface of said metal plate.

* * * * *